United States Patent [19]

Béchade et al.

[11] Patent Number: 4,912,339
[45] Date of Patent: Mar. 27, 1990

[54] PASS GATE MULTIPLEXER

[75] Inventors: Roland A. Béchade, South Burlington; Clarence R. Ogilvie, Huntington, both of Vt.

[73] Assignee: International Business Machines Corporation, Armonk, N.Y.

[21] Appl. No.: 280,071

[22] Filed: Dec. 5, 1988

[51] Int. Cl.[4] .................. H03K 17/56; H03K 17/40
[52] U.S. Cl. .............................. 307/243; 307/242; 307/572; 328/104; 328/137; 328/154
[58] Field of Search .............. 307/443, 242, 243, 572; 328/104, 137, 154

[56] References Cited

U.S. PATENT DOCUMENTS

| | | | |
|---|---|---|---|
| 3,614,327 | 10/1971 | Low et al. | 179/15 A |
| 3,654,394 | 4/1972 | Gordon | 179/15 BL |
| 4,038,564 | 7/1977 | Hakata | 307/243 |
| 4,356,413 | 10/1982 | Rosenbluth et al. | 307/243 |
| 4,390,988 | 6/1983 | Best et al. | 370/113 |
| 4,645,944 | 2/1987 | Uya | 307/243 |

Primary Examiner—Stanley D. Miller
Assistant Examiner—Richard Roseen
Attorney, Agent, or Firm—Stephen J. Limanek

[57] ABSTRACT

A circuit is provided, of the multiplexer type, which includes pass gates having first and second P-channel field effect transistors and first and second N-channel field effect transistors, a first data signal is applied to first current-carrying electrodes of the first P-channel and first N-channel transistors with a second data signal applied to first current-carrying electrodes of the second P-channel and second N-channel transistors, second current-carrying electrodes of the first and second P-channel transistors being connected together and second current-carrying electrodes of the first and second N-channel transistors being connected together and coupled to the second current-carrying electrodes of the first and second P-channel transistors. A true control pulse is applied to control electrodes of the first N-channel transistor and of the second P-channel transistor and a complemented control pulse, i.e., the complement of the true control pulse, is applied to control electrodes of the first P-channel transistors and of the second N-channel transistor. An output of the circuit is coupled to the second current-carrying electrodes of the transistors to selectively receive the first and second data signals.

15 Claims, 1 Drawing Sheet

| A | B | OUT |
|---|---|-----|
| 1 | 1 | D1  |
| 0 | 1 | D2  |
| 1 | 0 | D3  |
| 0 | 0 | D4  |

PASS GATE MULTIPLEXER

DESCRIPTION

1. Technical Field

This invention relates to integrated semiconductor switching circuits and, more particularly, to switching circuits of the multiplexer-type wherein the multiplexer as well as the circuitry controlling the multiplexer can be readily tested.

2. Background Art

Switching circuits of the multiplexer-type are well known; however, techniques for satisfactorily testing multiplexers and the circuits used for controlling the multiplexers have been generally unavailable or complex, since multiplexers are often inherently difficult, if not impossible, to fully test. Multiplexers using pass gates have been tested by applying pulses or signals derived from control logic, such as decoders, to the control elements of the pass gates. If the control logic is faulty, a multiplexer may pass a test when it should fail. More specifically, hen a logic circuit driving a control element or a pass gate is stuck inactive, i.e., always applies only 0 or low level pulses to the control element of the pass gate, the output of the multiplexer holds the charge from the previous state of another input signal. The output of the multiplexer may or may not be previously charged to the currently expected level. Consequently, the test may pass when it should fail. If the logic circuit driving the control element of the pass gate is, on the other hand, stuck active, i.e., always applies 1 or high level pulses, a multiselection may exist with the output of the multiplexer being controlled by the particular data input signals passing through the pass gates to the output of the multiplexer. The output may be undefined if the input data are of opposite polarity. With all control elements of the pass gates de-selected, i.e., with 0 or low level pulses applied to the control elements of all the pass gates, the output of the multiplexer is expected to be in the high impedance state. The data controlling the multiplexer output may or may not be the same as that expected at the output. Consequently, the test may pass when it should fail.

Known solutions to this problem include the use of a termination device or circuit connected to the output of the multiplexer for discharging the charge accumulated at the output of the multiplexer, and more specifically across the parasitic load capacitor connected to the output of the multiplexer. Such a solution is disclosed in commonly assigned U.S. patent application entitled "Testable Passgate Logic Circuits", having Ser. No. 183,865, filed by S. F. Oakland and C. R. Ogilvie on Apr. 20, 1988.

Multiplexers of different types may be found in the art. One known type has a tree arrangement, such as disclosed in U.S. Pat. Nos. 3,614,327, filed on Oct. 5, 1970, by G. M. Low et al and 3,654,394, filed on July 8, 1969, by B. M. Gordon, wherein field effect transistors are used to provide data multiplexers. Another circuit used for multiplexing a plurality of input signals to a single output, but which is not a tree network, employing N-channel and P-channel field effect transistors, is disclosed in U.S. Pat. No. 4,390,988, filed on July 14, 1981, by D. W. Best et al.

DISCLOSURE OF THE INVENTION

It is an object of this invention to provide improved circuits of the multiplexer-type wherein both the multiplexer and circuitry for controlling the multiplexer can be fully tested and wherein both density and performance of the multiplexer are enhanced.

In accordance with the teachings of this invention, a circuit is provided which includes a switching network, such as a multiplexer, having a P-channel device tree and an N-channel device tree arranged in parallel with the P-channel device tree operating under the control of true and complement control pulses. More specifically, a multiplexing circuit is provided which includes pass gates having first and second P-channel field effect transistors and first and second N-channel field effect transistors, a first data signal is applied to first current-carrying electrodes of the first P-channel and first N-channel transistors with a second data signal applied to first current-carrying electrodes of the second P-channel and second N-channel transistors, second current-carrying electrodes of the first and second P-channel transistors being connected together and second current-carrying electrodes of the first and second N-channel transistors being connected together and coupled to the current-carrying electrodes of the first and second P-channel transistors. A true control pulse is applied to control electrodes of the firs N-channel transistor and of the second P-channel transistor, and a control pulse, the complement of the true control pulse, is applied to control electrodes of the first P-channel transistor and of the second N-channel transistor. The output of the circuit, generally a capacitive load, is coupled to the second current-carrying electrodes of the transistors to selectively receive the first and second data signals.

The foregoing and other objects, features and advantages of the invention will be apparent from the following more particular description of the preferred embodiments of the invention, as illustrated in the accompanying drawing.

BEST MODE FOR CARRYING OUT THE INVENTION

Figures 1, 2:
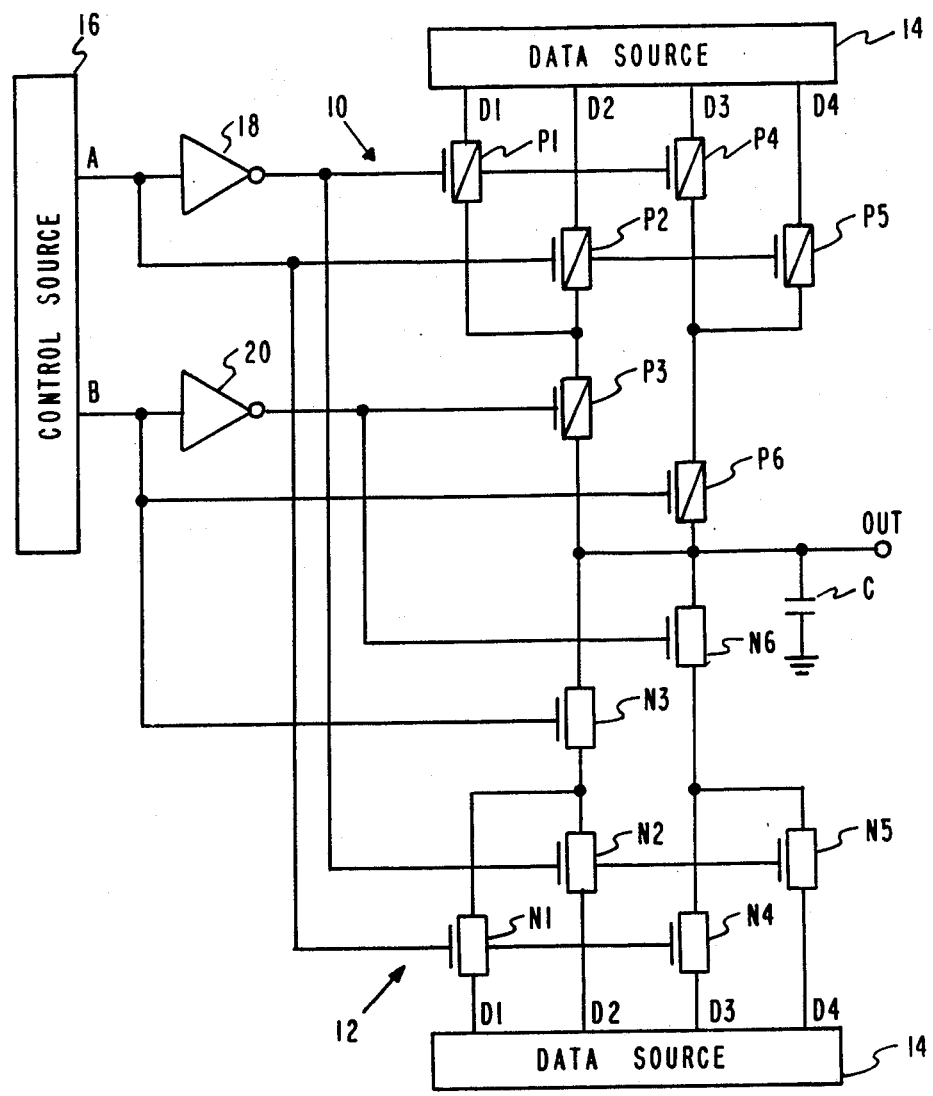
FIG. 1 is a circuit diagram of a preferred embodiment of the circuit of the present invention.
FIG. 2 is a truth table which may be sed in connection with the description of the operation of the present invention.

Referring to FIG. 1 of the drawing in more detail, there is shown a circuit diagram of a preferred embodiment of the testable pass gate multiplexer of the present invention. The circuit is made in complementary metal oxide semiconductor (CMOS) technology with P-channel field effect transistors indicated in the drawing by a rectangle with a diagonal line formed therein and a control element or gate electrode arranged adjacent thereto and with N-channel field effect transistors indicated by a rectangle without a diagonal line and a control element or gate electrode arranged adjacent thereto.

The testable CMOS pass gate multiplexer of the present invention illustrated in FIG. 1 of the drawing includes a first switching network in the form of a logic tree 10 having P-channel field effect transistors P1, P2, P3, P4, P5 and P6, and a second switching network in the form of a logic tree 12 having N-channel field effect transistors N1, N2, N3, N4, N5 and N6. A data source 14 is connected to the input of the first tree 10 so that a data signal D1 is applied to a first current-carrying electrode of the P-channel transistor P1, a data signal D2 is applied to a first current-carrying electrode of the transistor P2, a data signal D3 is applied to a first current-carrying electrode of the transistor P4 and a data signal D4 is applied to a first current-carrying electrode of the transistor P5. The data source 14 is also connected to the input of the second tree 12 so that the data signal D1 is applied to a first current-carrying electrode of the N-channel transistor N1, the data signal D2 is applied to a first current-carrying electrode of the transistor N2, the data signal D3 is applied to a first current-carrying electrode of the transistor N4 and the data signal D4 is applied to a first current-carrying electrode of the transistor N5. An output terminal OUT of the pass gate multiplexer of the present invention is connected to a first current-carrying electrode of each of the P-channel transistors P3 and P6 and of each of the N-channel transistors N3 and N6. The output terminal OUT is also connected to a capacitive load, such as a parasitic capacitor indicated at C. It should be noted that the first current-carrying electrodes of P-channel transistors P1, P2, P4 an P5 of the first tree 10 are connected to the first current-carrying electrodes of the N-channel transistors N1, N2, N and N5, respectively, of the second tree 12

The second current-carrying electrodes of the P-channel transistors P1, P2 and P3 of the first tree 10 are connected together and the second current-carrying electrodes of the P-channel transistors P4, P5 and P6 are also connected together. The second current-carrying electrodes of N-channel transistors N1, N2 and N3 of the second tree 12 are connected together and the second current-carrying electrodes of the N-channel transistors N4, N5 and N6 are also connected together.

Signal paths through the first and second trees 10 and 12 are controlled by control pulses A and B from a control source 16. Control source 16 is arranged so as to apply pulse A to an input of a first inverter 18 and to gate or control electrodes of the transistors P2, P5, N1 and N4, with the output of the inverter 18 being connected to gate or control electrodes of the transistors P1, P4, N2 and N5, and so as to apply pulse B to an input of a second inverter 20 and to gate or control electrodes of the transistors P6 and N3, with the output of the inverter 20 being connected to gate or control electrodes of transistors P3 and N6.

The data source 14 may be any known data source such as a data buss having a plurality of latches or the output from a memory, a register, an adder or an arithmetic logic unit, the control source 16 may be any known control source such as another plurality of latches, the output from another adder or a decoder, and each of the inverters 18 and 20 may be known CMOS inverters having serially arranged P-channel and N-channel transistors.

The operation of the circuit of FIG. 1 may best be understood by referring to the truth or logic table shown in FIG. 2 of the drawing. When control pulse A is a 1, i.e., a high voltage such as the supply voltage of the circuit, e.g., +5 volts, and control pulse B is also a 1, the data signal D1 from the data source 14 is received at the output terminal OUT. When the control pulse A is a 0, i.e., a low voltage such as zero volts or ground, and control pulse B is a 1, the data signal D2 from the data source 14 is received at the output terminal OUT. When the control pulse A is a 1 and the control pulse B is a 0, the data signal D3 from the data source 14 is received at the output terminal OUT. When the control pulse A is a 0 and the control pulse B is a 0, the data signal D4 from the data source 14 is received at the output terminal OUT. It can be seen, e.g., that when the control pulse A is a 1, the output at the first inverter 18 is the complement of the 1, i.e., the output at the inverter 18 is a 0, thus, P-channel transistors P1 and P4 in the first tree 10 are turned on and the P-channel transistors P2 and P5 are turned off, while the N-channel transistors N1 and N4 of the second tree 12 are turned on and the N-channel transistors N2 and N5 are turned off. It can also be seen that when the control pulse B is a 1, the output of the second inverter 20 is a 0, thus, P-channel transistor P3 in the first tree 10 is turned on and the P-channel transistor P6 is turned off, while the N-channel transistor N3 is turned on and the N-channel transistor N6 is turned off. With transistors P1 and P3 of the first tree 10 turned on and transistors P2 and P6 turned off, it should be noted that the data signal D1 passes to the output terminal OUT, while none of the other data signals D2, D3 and D4 are permitted to pass through the first tree 10 to the terminal OUT, likewise, with transistors N1 and N3 of the second tree turned on and transistors N2 and N6 turned off, it should again be noted that the data signal D1 passes to the output terminal OUT, while none of the other data signals D2, D3 and D4 are permitted to pass through the second tree 12 to the terminal OUT. If the data signal D1 is a 1, i.e., at +5 volts, the voltage at the terminal OUT will be at a full +5 volts, since the P-channel transistors P1 and P3 pass the entire data signal to the output terminal OUT. If, however, the data signal D1 is a 0, i.e., at zero volts, the output terminal OUT will discharge to zero volts through the N-channel transistors N1 and N3. Thus, it can be seen that a full voltage swing from 0 to +5 volts is provided at the output terminal OUT.

When control pulse A is a 0 and control pulse B is a 0, the voltage at the outputs of the inverters 18 and 20 is high, i.e., at 1, and, therefore, transistors P2, P5 and P6 of the first tree 10 are on, while transistors P1, P3 and P4 are off, and transistors N2, N5 and N6 of the second tree 12 are on, while transistors N1, N3 and N4 are off. Thus, the data signal D4 is applied to the output terminal OUT through transistors P5 an P6 of the first tree 10 and through transistors N5 and N6 of the second tree 12. In a similar manner it can be seen that data signal D2 passes through transistors P2 and P3 in the first tree 10 and through transistors N2 and N3 of the second tree 12 when control pulse A is a 0 and control pulse B is a 1, and that data signal D3 passes through transistors P4 and P6 of the first tree 10 and through transistors N4 and N6 of the second tree 12 when control pule A is a 1 and control pulse B is a 0, as indicated in the truth table of FIG. 2 of the drawing.

As illustrated in FIG. 1 of the drawing, the embodiment of this invention is a 4-way multiplexer. However, it should be understood that a 2-way multiplexer may be made by eliminating transistors P3, P4, P5, P6, N3, N4, N5 and N6 and connecting the output terminal OUT to the remaining transistors P1, P2, N1 and N2, with only control pulse A being used to control the 2-way multiplexer. The multiplexer can be extended, if desired, to 8-way or higher when more data signals are used by increasing in a similar manner the transistors in the first and second trees 10 and 12 and the control pulses and corresponding inverters. Furthermore, the multiplexer may have an odd number of way,, such as 3-ways, by eliminating transistors P4, P5, N4 and N5 in the circuit of FIG. 1 of the drawing.

When testing the multiplexer of this invention, if a control line, such as the line carrying the control pulse A, is stuck at a 1, a misselection may occur, i.e., paths for data signals D2 and D4 cannot be selected and a path for D1 or D3 will be selected instead. Normal testing will detect this error. In this situation multiple selection will not occur.

If, e.g., inverter 18 has its output shorted to its input, two input paths will be selected in the P-channel tree 10 or in the N-channel tree 12, depending upon the polarity of the control pulse A. If pulse A is a 1, then transistors N1 and N2 will be on, but transistors P1 and P2 will be off. If the data D1 and D2 are different, a 0 output will always dominate because of the drive difference between the two N-channel transistors N1 and N2 in the N-channel tree 12, with the output voltage at the output terminal OUT being below a threshold voltage or about 1 volt. Conversely, if the control line at pulse A is at a 0, the output will be controlled through the P-channel transistors P1 and P2, and the output terminal OUT will always be at 1 in case of a conflict between data D1 and D2.

Not only is this circuit fully testable, but it also eliminates several delays in the control path which are found in known multiplexers, thus performance is improved. Also, the number of transistors used in the multiplexer of this invention is reduced with respect to the transistors used in known testable multiplexers which improves circuit density. Furthermore, this multiplexer does not require an extensive and complex decoder to control the P-channel and N-channel trees which further reduces the size of the circuit. Nor does this multiplexer, which dissipates little or no d.c. power, require any additional test control lines such as used in known multiplexers to reset he output of the multiplxer to a known state during testing.

As can be readily understood, this multiplexer is fully testable because multiple paths cannot exist through the multiplexer by design. One output is always selected without adding restore or reset devices to bring the output to a known state, and it is self-decoding because of the complementary signal used with the tree arrangement While the invention has ben particularly shown and described with reference to preferred embodiments thereof, it will be understood by those skilled in the art that various changes in form and detail may be made therein without departing from the spirit and scope of the invention.

What is claimed is:

1. A circuit comprising
    first and second transistors of a first conductivity type, each having first and second current-carrying electrodes and a control electrode, the first electrodes of said first and second transistors being connected to each other,
    third and fourth transistors of a second conductivity type, each having first and second current-carrying electrodes and a control electrode, the first electrodes of said third and fourth transistors being connected to each other and being further coupled to the first current-carrying electrodes of said first and second transistors,
    means for applying a first data signal to the second current-carrying electrode of each of said first and third transistors,
    means for applying a second data signal to the second current-carrying electrode of each of said second and fourth transistors,
    means for applying a first control pulse having a true value to the control electrodes of said second and third transistors,
    means for applying a control pulse having a complemented value of said first control pulse to the control electrodes of said first and fourth transistors, and
    an output terminal coupled to the first current-carrying electrodes of said first, second, third and fourth transistors.

2. A circuit as set forth in claim 1 wherein each of said transistors is a field effect transistor.

3. A circuit as set forth in claim 2 wherein said first and second transistors are P-channel field effect transistors and said third and fourth transistors are first and second N-channel field effect transistors.

4. A circuit as set forth in claim 3 wherein said means for applying a first control pulse having a complemented value includes a first inverter having an input connected to said means for applying a first control pulse having a true value and having an output.

5. A circuit as set forth in claim 4 further including means for applying a third data signal,
    third and fourth P-channel field effect transistors, said third P-channel field effect b transistor being interposed between the first current-carrying electrodes of said first and second P-channel field effect transistors and said output terminal, and said fourth field effect transistor being interposed between said third data signal applying means and said output terminal,
    third and fourth N-channel field effect transistors, said third N-channel field effect transistor being interposed between the first current-carrying electrodes of said first and second N-channel filed effect transistors and said output terminal, and said fourth N-channel field effect transistor being interposed between said third data signal applying means and said output terminal,
    means for applying a second control pulse having a true value, and
    a second inverter having an input connected to said means for applying a second control pulse having a true value and an output connected to control electrodes of said third P-channel field effect transistor and of said fourth N-channel field effect transistor, and said means for applying a second control pulse having a true value being further connected to control electrodes of said fourth P-channel field effect transistor and of said third N-channel field effect transistor.

6. A circuit as set forth in claim 5 further including means for applying a fourth data signal,
    fifth and sixth P-channel field effect transistors, said fifth P-channel field effect transistor being interposed between said third data signal applying means an said fourth P-channel field effect transistor, and said sixth P-channel field effect transistor being interposed between said fourth data signal applying means and said fourth P-channel field effect transistor, a control electrode of said fifth P-channel field effect transistor being connected to the output of said first inverter and a control electrode of said sixth field effect transistor being connected to the input of said first inverter, and fifth and sixth N-channel field effect transistors, said fifth N-channel field effect transistor being interposed between said third data signal applying means and said fourth N-channel field effect transistor, and said sixth N-channel field effect transistor being interposed between said fourth data signal applying means and said fourth N-channel field effect transistor, a control electrode of said fifth N-channel field effect transistor being connected to the input of said first inverter and a control electrode of said sixth N-channel field effect transistor being connected to the output of said first inverter.

7. A circuit as set forth in claim 6 further including a capacitive load connected to said output terminal.

8. A multiplexer comprising first and second P-channel field effect transistors, each of said transistors having first and second current-carrying electrodes and a control electrode, the first electrodes of said first and second transistors being connected to each other, first and second N-channel field effect transistors, each of said N-channel transistors having first and second current-carrying electrodes and a control electrode, the first electrodes of said N-channel transistors being connected to each other and being further coupled to the first current-carrying electrodes of said P-channel transistors, means for applying a first data signal to the second current-carrying electrode of said first P-channel transistor and of said first N-channel transistor, means for applying a second data signal to the second current-carrying electrode of said second P-channel transistor and of said second N-channel transistor, means for applying a first control pulse having a true value of said first control pulse to the control electrodes of said second P-channel transistor and said first N-channel transistor, means for applying a control pulse having a complemented value to the control electrodes of said first P-channel transistor and said second N-channel transistor, and an output terminal coupled to the first current-carrying electrodes of said first and second P-channel transistors and of said first and second N-channel transistors.

9. A multiplexer as set forth in claim 8 wherein said means for applying a first control pulse having a complemented value includes a first inverter having an input connected to said means for applying a first control pulse having a true value and having an output.

10. A multiplexer as set forth in claim 9 further including means for applying a third data signal, third and fourth P-channel field effect transistors, said third P-channel field effect transistor being interposed between the first current-carrying electrodes of said first and second P-channel field effect transistors and said output terminal, and said fourth P-channel field effect transistor being interposed between said third data signal applying means and said output terminal, third and fourth N-channel field effect transistors, said third N-channel field effect transistor being interposed between the first current-carrying electrodes of said first and second N-channel field effect transistors and said output terminal, and said fourth N-channel field effect transistor being interposed between said third data signal applying means and said output terminal, means for applying a second control pulse having a true value, and a second inverter having an input connected to said means for applying a second control pulse having a true value and an output connected to a control electrode of said third P-channel field effect transistor and of said fourth N-channel field effect transistor, and said means for applying a second control pulse having a true value being further connected to a control electrode of said fourth P-channel field effect transistor and of said third N-channel field effect transistor.

11. A multiplexer as set forth in claim 10 further including means for applying a fourth data signal, fifth and sixth P-channel field effect transistors, said fifth P-channel field effect transistor being interposed between said third data signal applying means and said fourth P-channel field effect transistor, and said sixth P-channel field effect transistor being interposed between said fourth data signal applying means and said fourth P-channel field effect transistor, a control electrode of said fifth P-channel field effect transistor being connected to the output of said first inverter and a control electrode of said sixth P-channel field effect transistor being connected to the input of said first inverter, and fifth and sixth N-channel field effect transistors, said fifth N-channel field effect transistor being interposed between said third data signal applying means and said fourth N-channel field effect transistor, and said sixth N-channel field effect transistor being interposed between said fourth data signal applying means and said fourth N-channel field effect transistor, a control electrode of said fifth N-channel field effect transistor being connected to the input of said first inverter and a control electrode of said sixth N-channel field effect transistor being connected to the output of said first inverter.

12. A multiplexer as set forth in claim 11 further including a capacitive load connected to said output terminal.

13. A signal multiplexing circuit comprising first, second, third, fourth, fifth and sixth P-channel field effect transistors, each of said transistors having first and second electrodes and a control gate, the first electrodes of said first and second transistors being connected to the first electrode of said third transistor and said first electrodes of said fourth and fifth transistors being connected to the first electrode of said sixth transistor, first, second, third, fourth, fifth and sixth N-channel field effect transistors, each of said N-channel transistors having first and second electrodes and a control gate, the first electrodes of said first and second N-channel transistors being connected to the first electrode of said third N-channel transistor and the first electrodes of said fourth an fifth N-channel transistors being connected to the first electrode of said sixth N-channel transistor, a capacitive load connected to the second electrodes of said third and sixth P-channel transistors and of said third and sixth N-channel transistors, a data signal source having a first output connected to the second electrode of said first P-channel transistor and of said first N-channel transistor, a second output connected to the second electrode of said second P-channel transistor and of the second N-channel transistor, a third output connected to the second electrode of said fourth P-channel transistor and of said fourth N-channel transistor and a fourth output connected to the second electrode of said fifth P-channel transistor and of said fifth N-channel transistor, a control source having first and second outputs, first means coupled to the first output of said control source for applying a first true pulse to the control gates of said second and fifth P-channel transistors and of said first and fourth N-channel transistors and a first complemented pulse to the control gates of said first and fourth P-channel transistors and of said second and fifth N-channel transistors, and second means coupled to the second output of said control source for applying a second true pulse to the control gates of said sixth P-channel transistor and of said third N-channel transistor and a second complemented pulse to the control gates of said third P-channel transistor and of said sixth N-channel transistor.

14. A signal multiplexing circuit as set forth in claim 13 wherein said first means includes a first inverter having an input connected to the first output of said control source, and said second mean includes a second inverter having an input connected to the second output of said control source.

15. A signal multiplexing circuit comprising a data source having first, second, third and fourth outputs, a capacitive load, first, second, third, fourth, fifth and sixth P-channel field effect transistors, and first, second, third, fourth, fifth and sixth N-channel field effect transistors, each of said transistors having a control gate, said first and second P-channel transistors being serially connected between the first output of said data source and said capacitive load, said third P-channel transistor being connected between the second output of said data source and a common point between said first and second P-channel transistors, said fourth and fifth P-channel transistors being serially connected between the third output of said data source and said capacitive load, said sixth P-channel transistor being connected between the fourth output of said data source and a common point between said fourth and fifth P-channel transistors, said first and second N-channel transistors being serially connected between the first output of said data source and said capacitive load, said third N-channel transistor being connected between the second output of said data source and a common point between said first and second N-channel transistors, said fourth and fifth N-channel transistors being serially connected between the third output of said data source and said capacitive load, and said sixth N-channel transistor being connected between the fourth output of said data source and a common point between said fourth and fifth N-channel transistors, a control source having first and second outputs, a first inverter having an input connected to the first output of said control source and to the control gates of said third and sixth P-channel transistors and of said first and fourth N-channel transistors, and an output connected to the control gates of said first and fourth P-channel transistors and of said third and sixth N-channel transistors, and a second inverter having an input connected to the second output of said control source and to the control gate of said fifth P-channel transistor and of said second N-channel transistor, and an output connected to the control gate of said second P-channel transistor and of said fifth N-channel transistor.

* * * * *